(12) United States Patent
Su

(10) Patent No.: US 11,582,869 B2
(45) Date of Patent: Feb. 14, 2023

(54) COMPOSITE METAL FOIL AND PREPARATION METHOD THEREOF

(71) Applicant: GUANGZHOU FANGBANG ELECTRONIC CO., LTD., Guangdong (CN)

(72) Inventor: Zhi Su, Guangdong (CN)

(73) Assignee: GUANGZHOU FANGBANG ELECTRONIC CO., LTD., Guangdong (CN)

(*) Notice: Subject to any disclaimer, the term of this patent is extended or adjusted under 35 U.S.C. 154(b) by 0 days.

(21) Appl. No.: 17/309,059

(22) PCT Filed: Nov. 6, 2019

(86) PCT No.: PCT/CN2019/116090
§ 371 (c)(1),
(2) Date: Apr. 19, 2021

(87) PCT Pub. No.: WO2020/119340
PCT Pub. Date: Jun. 18, 2020

(65) Prior Publication Data
US 2021/0321515 A1    Oct. 14, 2021

(30) Foreign Application Priority Data

Dec. 10, 2018  (CN) .......................... 201811514597.6

(51) Int. Cl.
*H05K 1/09* (2006.01)
*B32B 15/01* (2006.01)
(Continued)

(52) U.S. Cl.
CPC .......... *H05K 1/0393* (2013.01); *B32B 15/00* (2013.01); *B32B 15/01* (2013.01); *C23C 28/00* (2013.01);
(Continued)

(58) Field of Classification Search
None
See application file for complete search history.

(56) References Cited

U.S. PATENT DOCUMENTS

| | | | |
|---|---|---|---|
| 6,183,880 B1* | 2/2001 | Yoshioka | C25D 5/605 |
| | | | 428/678 |
| 2011/0209903 A1* | 9/2011 | Uno | C25D 5/12 |
| | | | 174/255 |

(Continued)

FOREIGN PATENT DOCUMENTS

| | | |
|---|---|---|
| CN | 1323695 A | 11/2001 |
| CN | 102555333 A | 7/2012 |

(Continued)

*Primary Examiner* — Seth Dumbris
(74) *Attorney, Agent, or Firm* — Shumaker, Loop & Kendrick, LLP; James D. Miller

(57) ABSTRACT

A composite metal foil and a preparation method thereof are provided. The composite metal foil includes a carrier layer, a barrier layer, a striping layer, and a metal foil layer. The carrier layer, the barrier layer, the striping layer, and the metal foil layer are sequentially stacked, the barrier layer includes a metal bonding layer and a high-temperature resistant layer stacked, and the metal bonding layer is disposed between the carrier layer and the high-temperature resistant layer. The striping layer is disposed between the carrier layer and the metal foil layer so as to facilitate peeling of the carrier layer, and the barrier layer is disposed between the carrier layer and the metal foil layer so as to prevent the carrier layer and the metal foil layer from diffusing mutually to cause bonding at a high temperature, so that the carrier layer and the metal foil layer are easy to peel off. In addition, the metal bonding layer is disposed between the carrier layer and the high-temperature resistant layer, so that the barrier layer is not easy to separate from the carrier layer, and peeling between the barrier layer and the carrier layer is prevented.

22 Claims, 3 Drawing Sheets

(51) Int. Cl.
   *H05K 1/03*   (2006.01)
   *H05K 1/11*   (2006.01)
   *H05K 3/02*   (2006.01)
   *B32B 15/00*  (2006.01)
   *C23C 28/00*  (2006.01)
   *C25D 5/10*   (2006.01)
   *C25D 3/38*   (2006.01)

(52) U.S. Cl.
   CPC ............... *H05K 1/09* (2013.01); *H05K 1/118* (2013.01); *H05K 3/025* (2013.01); *C25D 3/38* (2013.01); *C25D 5/10* (2013.01); *Y10T 428/12* (2015.01)

(56) References Cited

U.S. PATENT DOCUMENTS

2017/0042025 A1* 2/2017 Miyamoto ........... H05K 3/0032
2017/0362733 A1* 12/2017 Kohiki .................. H05K 3/025
2019/0029125 A1* 1/2019 Matsuura ................ H05K 1/09

FOREIGN PATENT DOCUMENTS

| CN | 103392028 A | 11/2013 | |
|---|---|---|---|
| KR | 20140023744 A * | 2/2014 | |
| WO | 2012133638 A1 | 10/2012 | |
| WO | WO-2015122258 A1 * | 8/2015 | ............... C25D 1/04 |
| WO | 2017149811 A1 | 9/2017 | |
| WO | WO-2017150284 A1 * | 9/2017 | ............. B32B 15/04 |

* cited by examiner

COMPOSITE METAL FOIL AND PREPARATION METHOD THEREOF

CROSS-REFERENCE TO RELATED PATENT APPLICATIONS

This patent application is a United States national phase patent application based on PCT/CN2019/116090 filed on Nov. 6, 2019, which claims the benefit of Chinese Patent Application No. 201811514597.6 filed on Dec. 10, 2018, the entire contents of both of which are hereby incorporated herein by reference.

TECHNICAL FIELD

The disclosure relates to the technical field of materials, and in particular to a composite metal foil and a preparation method thereof.

BACKGROUND ART

At present, a substrate is a processing material of a Flexible Printed Circuit board (FPC), which is generally composed of a flexible insulating base film and a composite metal foil. When the substrate is prepared in the conventional art, a side of the composite metal foil (including a carrier layer and a metal foil layer) is firstly press-fitted with the flexible insulating base film to obtain the substrate, the side of the composite metal foil is provided with the metal foil layer, and the carrier layer needs to be peeled off when the substrate is used. However, due to the fact that the composite metal foil and the flexible insulating base film need to be press-fitted at a high temperature, the carrier layer and the metal foil layer are easy to diffuse mutually at the high temperature, so that the carrier layer is bonded with the metal foil layer, and the carrier layer and the metal foil layer are difficult to peel off.

SUMMARY

The embodiments of the disclosure aim to provide a composite metal foil and a preparation method thereof, which can avoid bonding caused by a mutual diffusion between a carrier layer and a metal foil layer of the composite metal foil at a high temperature so that the carrier layer and the metal foil layer are easy to peel off.

In order to solve the above technical problem, the embodiments of the disclosure provide a composite metal foil, which includes a carrier layer, a barrier layer, a striping layer and a metal foil layer.

The carrier layer, the barrier layer, the striping layer and the metal foil layer are sequentially stacked, the barrier layer comprises a metal bonding layer and a high-temperature resistant layer stacked which are stacked, and the metal bonding layer is disposed between the carrier layer and the high-temperature resistant layer.

As a preferred solution, a peel strength between the carrier layer and the barrier layer is greater than the peel strength between the striping layer and the metal foil layer at a temperature of 20-400° C.

As a preferred solution, an adhesion test level between the carrier layer and the barrier layer is 0 or 1 or 2, and the peel strength between the striping layer and the metal foil layer is 0.001-2 N/cm.

As a preferred solution, the peel strength between the striping layer and the metal foil layer is greater than or equal to the peel strength between the striping layer and the barrier layer.

As a preferred solution, the high-temperature resistant layer is an organic high-temperature resistant layer, or the high-temperature resistant layer is made of any one or more of tungsten, chromium, zirconium, titanium, nickel, molybdenum, cobalt, and graphite.

As a preferred solution, the high-temperature resistant layer is a single-layer alloy structure; or the high-temperature resistant layer is a multilayer structure formed by a single material layer or a multilayer structure formed by an alloy layer and a single material layer, the single material layer being made of the same chemical element.

As a preferred solution, the metal bonding layer is made of any one or more materials of a first type of metal; or the metal bonding layer is made of any one or more materials of a second type of metal; or the metal bonding layer is made of any one or more materials in a first type of metal and any one or more materials in a second type of metal.

The first type of metal is metal easy to bond with the carrier layer, and the second type of metal is metal easy to bond with the high-temperature resistant layer.

As a preferred solution, the first type of metal is copper or zinc, and the second type of metal is nickel or iron or manganese.

As a preferred solution, the metal bonding layer is a single metal layer made of the first type of metal or the second type of metal.

As a preferred solution, the metal bonding layer is a single-layer alloy structure made of the first type of metal and the second type of metal.

As a preferred solution, the metal bonding layer comprises a single metal layer which is made of the first type of metal and connected to the carrier layer, and the metal bonding layer further includes a single metal layer which is made of the second type of metal and connected to the high-temperature resistant layer.

As a preferred solution, the metal bonding layer includes a multilayer structure formed by an alloy layer and a single metal layer, the alloy layer being made of the first type of metal and the second type of metal, and the single metal layer being made of the first type of metal or the second type of metal.

As a preferred solution, the striping layer is made of any one or more of nickel, silicon, molybdenum, graphite, titanium, and niobium; or, the striping layer is made of an organic polymer material.

As a preferred solution, a thickness of the metal foil layer is less than or equal to 9 μm.

As a preferred solution, the metal foil layer is a copper foil or an aluminum foil; and/or, the carrier layer is made of copper or aluminum or an organic thin film.

As a preferred solution, a roughness Rz of a face of the carrier layer s less than or equal to 5 μm, and the face is close to the metal foil layer; and/or the roughness Rz of a face of the metal foil layer is less than or equal to 3.0 μm, and the face is away from the carrier layer.

As a preferred solution, a first anti-oxidation layer is disposed on a side of the carrier layer, and the side of the carrier layer is close to the barrier layer; and/or a second anti-oxidation layer is disposed on a side of the metal foil layer away from the barrier layer, and the side of the metal foil layer is away from the barrier layer.

The composite metal foil provided by the embodiments of the disclosure includes a carrier layer, a barrier layer, a striping layer and a metal foil layer sequentially stacked, the barrier layer includes a metal bonding layer and a high-temperature resistant layer stacked, and the metal bonding layer is disposed between the carrier layer and the high-temperature resistant layer. The striping layer is disposed between the carrier layer and the metal foil layer so as to facilitate peeling of the carrier layer, and the barrier layer is disposed between the carrier layer and the metal foil layer so as to prevent the carrier layer and the metal foil layer from diffusing mutually to cause bonding at a high temperature, so that the carrier layer and the metal foil layer are easy to peel off. In addition, the metal bonding layer is disposed between the carrier layer and the high-temperature resistant layer, so that the barrier layer is not easy to separate from the carrier layer, and peeling between the barrier layer and the carrier layer is prevented.

DETAILED DESCRIPTION OF THE EMBODIMENTS

The technical solutions in the embodiments of the disclosure will be clearly and completely described hereinbelow with the drawings in the embodiments of the disclosure. It is apparent that the described embodiments are only part of the embodiments of the disclosure, not all of the embodiments. On the basis of the embodiments of the disclosure, all other embodiments obtained on the premise of no creative work of those of ordinary skill in the art fall within the scope of protection of the disclosure.

Figure 1:
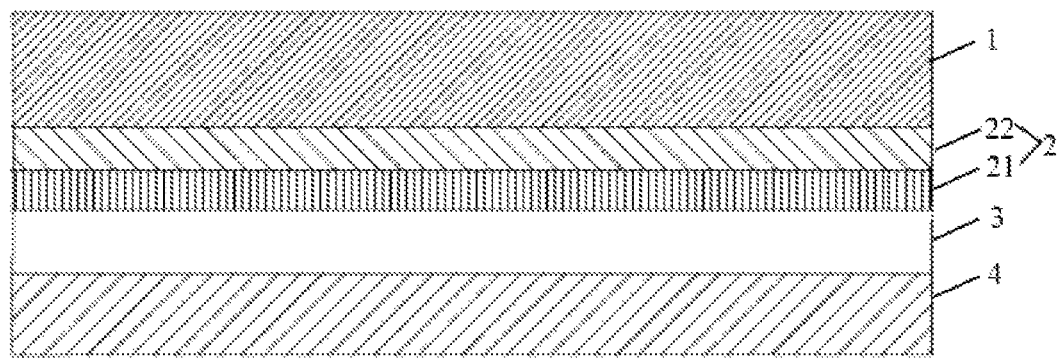
FIG. 1 is a schematic structural diagram of an embodiment of a composite metal foil provided by the disclosure.

Referring to FIG. 1, in order to solve the above technical problem, an embodiment of the disclosure provides a composite metal foil, which comprises a carrier layer 1, a barrier layer 2, a striping layer 3, and a metal foil layer 4.

The carrier layer 1, the barrier layer 2, the striping layer 3, and the metal foil layer 4 are sequentially stacked, the barrier layer 2 comprises a metal bonding layer 22 and a high-temperature resistant layer 21 which are stacked, and the metal bonding layer 22 is disposed between the carrier layer 1 and the high-temperature resistant layer 21.

In the embodiments of the disclosure, the striping layer 3 is disposed between the carrier layer 1 and the metal foil layer 4 so as to facilitate peeling of the carrier layer 1. The barrier layer 2 is disposed between the carrier layer 1 and the metal foil layer 4 so as to prevent the carrier layer 1 and the metal foil layer 4 from diffusing mutually to cause bonding at a high temperature, therefore the carrier layer 1 and the metal foil layer 4 are easy to peel off. In addition, the metal bonding layer 22 is disposed between the carrier layer 1 and the high-temperature resistant layer 21, so that the barrier layer 2 is not easy to separate from the carrier layer 1, and peeling between the barrier layer 2 and the carrier layer 1 is prevented.

In the embodiments of the disclosure, in order to ensure that the carrier layer 1, the barrier layer 2 and the striping layer 3 are peeled off simultaneously when the composite metal foil is used, the peel strength between the carrier layer 1 and the barrier layer 2 is greater than the peel strength between the striping layer 3 and the metal foil layer 4 at a temperature of 20-400° C. Preferably, an adhesion test level between the carrier layer 1 and the barrier layer 2 is 0 or 1 or 2, and the peel strength between the striping layer 3 and the metal foil layer 4 is 0.001-2 N/cm. The adhesion test level in the present embodiment is an ISO level and may refer to the standard "Cross-cut Test for Color Paint and Varnish Film GBT9286-1998". In addition, the adhesion test level in the present embodiment may correspond to an ASTM level. For example, an adhesion test level of 0 corresponds to an ASTM level of 5B, an adhesion test level of 1 corresponds to an ASTM level of 4B, and so on, which will not be described in further detail herein. The adhesion test level can reflect the peel strength between the carrier layer 1 and the barrier layer 2, and as the level is higher, the peel strength between the striping layer 1 and the metal foil layer 2 is larger. The adhesion test level between the carrier layer 1 and the barrier layer 2 is in the first three levels, that is, an adhesive force between the carrier layer 1 and the barrier layer 2 is relatively large, and the peel strength between the striping layer 3 and the metal foil layer 4 is very small. Therefore, the peel strength between the carrier layer 1 and the barrier layer 2 is always far greater than the peel strength between the striping layer 3 and the metal foil layer 4, so that when the composite metal foil is used, the carrier layer 1, the barrier layer 2 and the striping layer 3 can be conveniently peeled off from the metal foil layer 4 at the same time.

Figure 3:
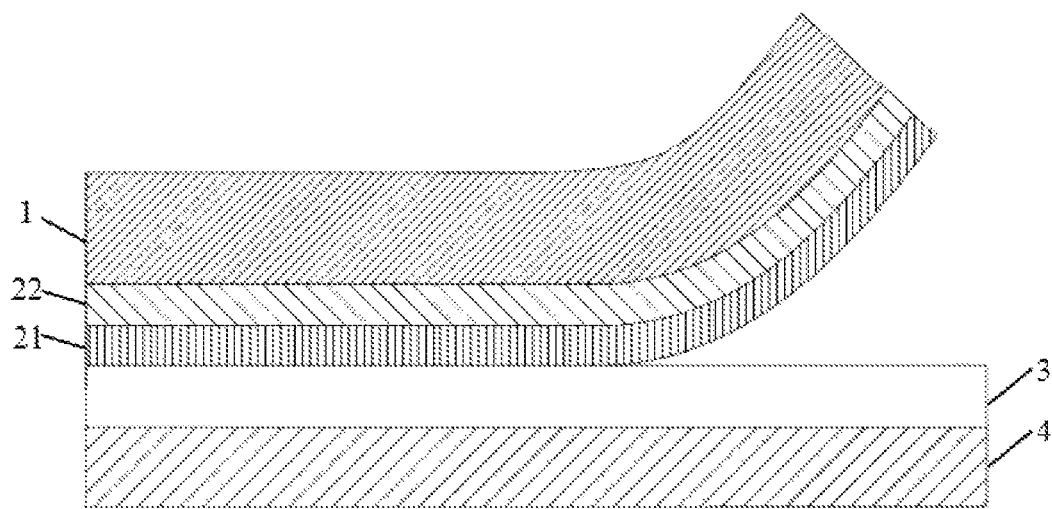
FIG. 3 is a schematic peeling diagram of the embodiments of a composite metal foil provided by the disclosure.
Figure 4:
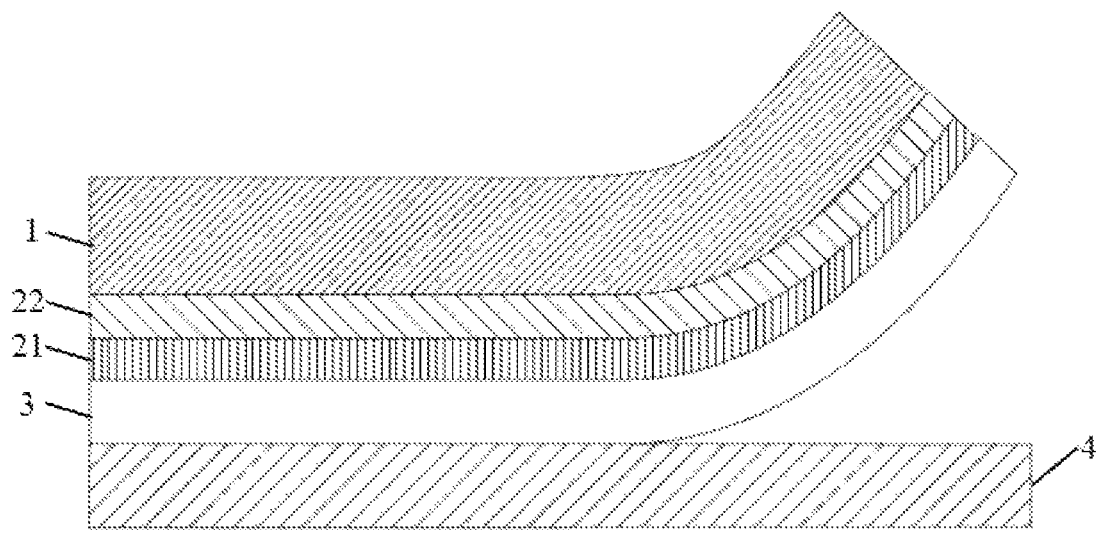
FIG. 4 is another schematic peeling diagram of the embodiments of a composite metal foil provided by the disclosure.

As shown in FIG. 3, in the embodiments of the disclosure, the peel strength between the striping layer 3 and the metal foil layer 4 is greater than or equal to the peel strength between the striping layer 3 and the barrier layer 2. Since the peel strength between the striping layer 3 and the metal foil layer 4 is greater than or equal to the peel strength between the striping layer 3 and the barrier layer 2, when the composite metal foil is peeled off, the striping layer 3 can partially or completely remain on the metal foil layer 4, so that the metal foil layer 4 can be prevented from being oxidized, and the metal foil layer 4 is further effectively protected. Of course, the peel strength between the striping layer 3 and the metal foil layer 4 may also be smaller than the peel strength between the striping layer 3 and the barrier layer 2, so that when the composite metal foil is peeled off, the striping layer 3 can partially or completely remain on the barrier layer 2 and be simultaneously peeled off from the metal foil layer 4 with the carrier layer 1 and the barrier layer 2, as shown in FIG. 4, detailed descriptions are omitted herein.

Referring to FIG. 1, the thickness of the barrier layer 2 is greater than or equal to 10 Å. Preferably, the thickness of the barrier layer 2 is 10-500 Å. The high-temperature resistant layer 21 is an organic high-temperature resistant layer. When the high-temperature resistant layer 21 is an organic high-temperature resistant layer, it is formed by a single material layer made of one or more of a nitrogen-containing organic compound, a sulfur-containing organic compound and a carboxylic acid, or formed by multiple single material layers. Or, the high-temperature resistant layer 21 is made of any one or more of tungsten, chromium, zirconium, titanium, nickel, molybdenum, cobalt, and graphite. Preferably, the high-temperature resistant layer 21 is a single-layer alloy structure; or the high-temperature resistant layer 21 is a multilayer structure formed by a single material layer or a multilayer structure formed by an alloy layer and a single material layer, the single material layer being made of the same chemical element. Specifically, the single-layer alloy structure is a single-layer structure made of an alloy material, for example, a single-layer structure made of a tungsten-chromium alloy. The high-temperature resistant layer 21 is a multilayer structure composed of a single material layer or a multilayer structure composed of an alloy layer and a single material layer, for example, a multilayer structure composed of a tungsten metal layer and a chromium metal layer, or a multilayer structure composed of a tungsten-chromium alloy layer and a zirconium metal layer.

Figure 2:
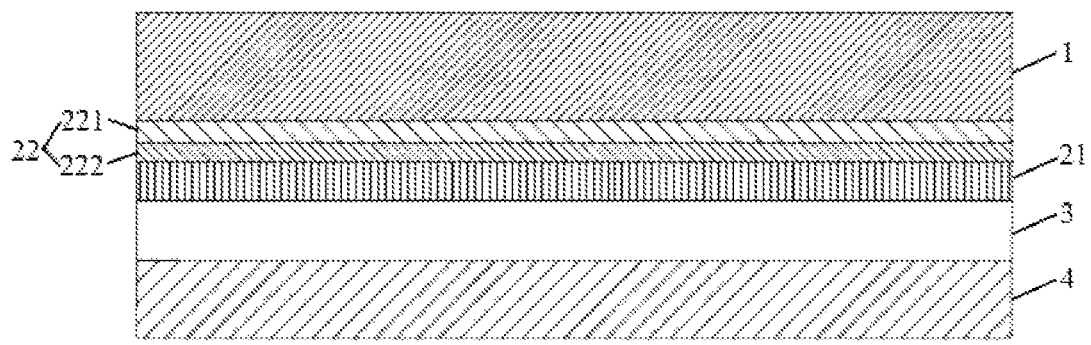
FIG. 2 is a schematic structural diagram of another embodiment of a composite metal foil provided by the disclosure.

As shown in FIG. 1 and FIG. 2, in order to prevent peeling delamination between the barrier layer 2 and the carrier layer 1, the metal bonding layer 22 is made of any one or more materials of a first type of metal; or the metal bonding layer 22 is made of any one or more materials of a second type of metal; or the metal bonding layer 22 is made of any one or more materials in a first type of metal and any one or more materials in a second type of metal. The first type of metal is metal easy to bond with the carrier layer, and the second type of metal is metal easy to bond with the high-temperature resistant layer 21, thereby it can prevent peeling between the carrier layer 1 and the barrier layer 2. Preferably, the first type of metal is copper or zinc, and the second type of metal is nickel or iron or manganese. By setting the metal bonding layer 22, the barrier layer 2 can be firmly connected to the carrier layer 1, which can prevent peeling between the barrier layer 2 and the carrier layer 1. In addition, since the bonding force between the first type of metal and the carrier layer 1 is strong and the bonding force between the second type of metal and the high-temperature resistant layer 21 is strong, the single metal layer made of the first type of metal is connected to the carrier layer 1, and the single metal layer made of the second type of metal is connected to the high-temperature resistant layer 21, so that the barrier layer 2 is not easily separated from the carrier layer 1.

In the embodiments of the disclosure, the structure of the metal bonding layer 22 may include, but is not limited to, the following: (1) the metal bonding layer 22 is a single metal layer made of the first type of metal; the metal bonding layer 22 is a single metal layer made of the second type of metal; (3) the metal bonding layer 22 is a single-layer alloy structure made of the first type of metal and the second type of metal, for example, a single-layer alloy structure made of a copper-nickel alloy; (4) the metal bonding layer 22 includes a single metal layer made of the first type of metal and connected to the carrier layer 1, the metal bonding layer 22 further comprises a single metal layer made of the second type of metal and connected to the high-temperature resistant layer 21. For example, a multilayer structure formed by a copper metal layer and a nickel metal layer, the copper metal layer is connected to the carrier layer 1, and the nickel metal layer is connected to the high-temperature resistant layer 21; (5) the metal bonding layer 22 includes a multilayer structure formed by an alloy layer and a single metal layer, where the alloy layer of the metal bonding layer 22 is made of the first type of metal and the second type of metal, and the single metal layer of the metal bonding layer 22 is made of the first type of metal or the second type of metal. For example, the alloy layer is made of a copper-nickel alloy and the single metal layer is made of manganese, Hereinafter, the structure of the metal bonding layer 22 will be described in detail in the above-mentioned case (4). Referring to FIG. 2, in the present embodiment, the metal bonding layer 22 is made of a first-type metal single-layer structure 221 and a second-type metal single-layer structure 222. The first-type metal single-layer structure 221 is a single metal layer made of a first type of metal and connected to the carrier layer 1, and the second-type metal single-layer structure 222 is a single metal layer made of a second type of metal and connected to the high-temperature resistant layer 21.

In the embodiments of the disclosure, a structure may also be disposed between the first-type metal single-layer structure 221 and the second-type metal single-layer structure 222, and the structure is made of a single-layer structure of the first type of metal and/or a single-layer structure of the second type of metal. With the structure, the connection firmness between the barrier layer 2 and the carrier layer 1 is further improved, and peeling between the barrier layer 2 and the carrier layer 1 is further prevented.

In the embodiments of the disclosure, the striping layer 3 is made of any one or more of nickel, silicon, molybdenum, graphite, titanium, and niobium; or, the striping layer 3 is made of an organic polymer material. The thickness of the striping layer 3 is preferably 10-500 Å. Since a uniform metal foil layer 4 is difficult to form when the striping layer 3 is too thick, a large number of pinholes are easily generated in the metal foil layer 4. When the metal foil layer 4 is provided with pinholes, an open circuit phenomenon is easily generated after the metal foil layer is etched into a circuit. When the striping layer 3 is too thin, it is easy to cause difficulty in peeling between the striping layer 3 and the metal foil layer 4. Therefore, the thickness of the striping layer 3 is preferably 10-500 Å, so that it is ensured that a uniform metal foil layer 4 can be formed, and the generation of a large number of pinholes in the metal foil layer 4 is avoided, while it is easy to peel between the striping layer 3 and the metal foil layer 4.

In the present embodiment, the thickness of the metal foil layer 4 is less than or equal to 9 μm. In order to meet the requirements of fine circuit manufacturing in a circuit board, it is preferable that the metal foil layer 4 has a thickness of 6 μm, 5 μm, 4 μm, 2 μm, or the like, thereby obtaining an ultra-thin metal foil layer 4 favorable for forming a fine circuit board. In addition, in the present embodiment, a metal bonding layer 22 is provided in order to be able to peel off from the carrier layer 1 to obtain a complete ultra-thin metal foil layer 4 with few pinholes, particularly a metal foil layer having a thickness of 2 μm, 4 μm, or the like. The peel strength between the barrier layer 2 and the carrier layer 1 is strong by the metal bonding layer 22, and it ensures effectively that the carrier layer 1 can be stably peeled off from the metal foil layer 4, and further a complete ultra-thin metal foil layer 4 is obtained. Besides, the surface of the carrier layer 1 is treated by the metal bonding layer 22, so that the whole surface of the carrier layer 1 is more uniform and compact. By this treatment, the ultra-thin metal foil layer 4 with fewer pinholes can be conveniently peeled off from the carrier layer 1, and subsequent circuit manufacturing is facilitated. In addition, the metal foil layer 4 is preferably a copper foil or an aluminum foil; the carrier layer 1 may be copper, aluminum or an organic thin film and the like. Since the carrier layer 1 mainly plays a bearing role, a certain thickness is required, and when the carrier layer 1 is copper or aluminum, the thickness of the carrier layer 1 is preferably 9-50 μm; when the carrier layer 1 is an organic thin film, the thickness of the carrier layer 1 is preferably 20-100 μm.

In the embodiments of the disclosure, the roughness Rz of a face of the carrier layer 1 is less than or equal to 5 μm, which is close to the metal foil layer 4; and/or the roughness Rz of a face of the metal foil layer 4 is less than or equal to 3.0 μm, which is close to the metal foil layer 4. When the metal foil layer 4 is a copper foil, the roughness of the copper foil is larger, and the bonding force between the copper foil and other materials is larger. But when the roughness of the copper foil is too large, the copper foil cannot be applied to a circuit board for high-frequency signal transmission. So the roughness Rz of a common copper foil is 0.5-3.0 μm. When the copper foil is applied at a high frequency, the roughness of the copper foil is set to be less than 0.5 μm, so that the copper foil can be applied to a circuit board for high-frequency signal transmission on the premise of ensuring the adhesive force between the copper foil and other materials.

It is to be noted that the roughness Rz represents the maximum height of a contour: distance between a crest line and a valley line of the contour. The sampling length is the length of a reference line specified for evaluating the surface roughness, the sampling length should adopt the length which can reflect the surface roughness features according to the formation condition and the texture features of actual surfaces of parts, and the sampling length should be measured according to the total trend of an actual surface contour.

In the embodiments of the disclosure, in order to prevent the carrier layer 1 from oxidizing, a first anti-oxidation layer is disposed on a side of the carrier layer 1, which is close to the barrier layer 2. By setting the first anti-oxidation layer on a side of the carrier layer 1 close to the barrier layer 2 to prevent the carrier layer 1 from oxidizing, the carrier layer 1 is protected. In order to prevent the metal foil layer 4 from oxidizing, a second anti-oxidation layer is disposed on a side of the metal foil layer 4 away from the barrier layer 2. By setting the second anti-oxidation layer on a side of the metal foil layer 4 away from the barrier layer 2 to prevent the metal foil layer 4 from oxidizing, the metal foil layer 4 is protected.

Figure 5:
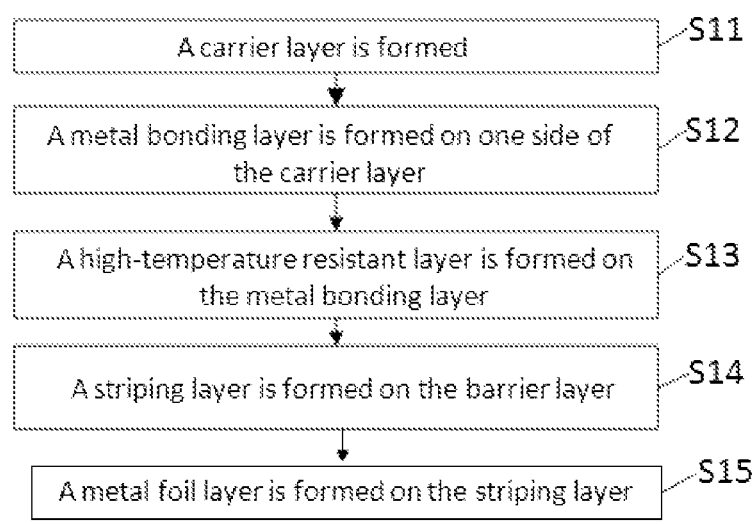
FIG. 5 is a schematic flow diagram of an embodiment of a preparation method of a composite metal foil provided by the disclosure.

Referring to FIG. 5, in order to solve the same technical problem, the embodiments of the disclosure also provide a preparation method for preparing the composite metal foil, which includes the following steps:

In S11, a carrier layer 1 is formed.

In S12, a metal bonding layer 22 is formed on one side of the carrier layer 1.

In S13, a high-temperature resistant layer 21 is formed on the metal bonding layer 22, and a barrier layer 2 is formed with the metal bonding layer 22 and the high-temperature resistant layer 21.

In S14, a striping layer 3 is formed on the barrier layer 2.

In S15, a metal foil layer 4 is formed on the striping layer 3.

In order to ensure that the carrier layer 1, the barrier layer 2 and the striping layer 3 can be conveniently peeled off from the metal foil layer 4 simultaneously when the composite metal foil is used, in the embodiments of the disclosure, the peel strength between the carrier layer 1 and the barrier layer 2 is greater than the peel strength between the striping layer 3 and the metal foil layer 4 at a temperature of 20-400° C. Preferably, an adhesion test level between the carrier layer and the barrier layer is 0 or 1 or 2 at a temperature of 20-400° C., and the peel strength between the striping layer 3 and the metal foil layer 4 is 0.001-2 N/cm.

In the embodiments of the disclosure, the first type of metal is metal easy to bond with the carrier layer 1, and the second type of metal is metal easy to bond with the high-temperature resistant layer 21. Preferably, the first type of metal is copper or zinc, and the second type of metal is nickel or iron or manganese.

Due to the electroplating mode the roughness of the barrier layer 2 and the striping layer 3 is easily influenced by a current during electroplating, so that the surface roughness of the barrier layer 2 and the striping layer 3 which are formed is very non-uniform. Subsequently, the surface roughness of the metal foil layer 4 is also non-uniform, and it is not helpful for a good peel stability, the number of pinholes which are formed, and a circuit manufacturing. Based on this, in the embodiments of the disclosure, steps S12, S13 and S14 are preferably performed by sputtering, the current in the process of sputtering is preferably 6-12 A, and the voltage is preferably 300-500V. The metal bonding layer 22 and the high-temperature resistant layer 21 is formed by sputtering, and form the barrier layer 2, so as to ensure that the uniform and compact barrier layer 2 is obtained. The uniform and compact striping layer 3 is formed by sputtering. Thereby it is beneficial for improving the peel stability of the composite metal foil and effectively reducing the number of pinholes. In addition, the metal foil layer 4 is preferably formed by electroplating, before the metal foil layer 4 is formed, the uniform and compact barrier layer 2 and striping layer 3 are formed by sputtering, uniform electroplating of the metal foil layer 4 is facilitated, therefore the surface roughness of the formed metal foil layer 4 is uniform, subsequent circuit manufacturing is facilitated, and it is helpful to obtain a thinner metal foil layer 4

In the embodiments of the disclosure, the process that the metal bonding layer 22 is formed on one side of the carrier layer 1 comprises that: a single metal layer is formed on one side of the carrier layer 1, while the single metal layer is made of a first type of metal or a second type of metal.

In the embodiments of the disclosure, the process that the metal bonding layer 22 is formed on one side of the carrier layer 1 may also comprise that: a single-layer alloy structure is formed on one side of the carrier layer 1, while the single-layer alloy structure formed is made of a first type of metal and a second type of metal.

In the embodiments of the disclosure, the process that the metal bonding layer 22 is formed on one side of the carrier layer 1 may also comprise that: a multilayer structure is formed on one side of the carrier layer 1, while the multilayer structure includes a single metal layer made of the first type of metal and connected to the carrier layer 1, and the multilayer structure further include a single metal layer made of the second type of metal and is connected to the high-temperature resistant layer 21.

In the embodiments of the disclosure, the process that the metal bonding layer 22 is formed on one side of the carrier layer 1 may also comprise that: a multilayer structure is formed on one side of the carrier layer 1, and the multilayer structure includes an alloy layer and a single metal layer, with the alloy layer being made of a first type of metal and a second type of metal, and the single metal layer being made of a first type of metal or a second type of metal.

The high-temperature resistant layer 21 may be an organic high-temperature resistant layer; or, the high-temperature resistant layer 21 is a single-layer alloy structure. Or the high-temperature resistant layer 21 is a multilayer structure formed by a single material layer or a multilayer structure formed by an alloy layer and a single material layer, the single material layer being made of the same chemical element. The high-temperature resistant layer 21 is an organic high-temperature resistant layer, or, the high-temperature resistant layer 21 is made of any one or more of tungsten, chromium, zirconium, titanium, nickel, molybdenum, cobalt, and graphite.

In the embodiments of the disclosure, the method further includes the following steps after the carrier layer 1 is formed:

In S111, the carrier layer 1 is roughened to obtain a roughened carrier layer 1.

In S112, a first anti-oxidation layer is formed on the roughened carrier 1.

The carrier layer 1 may be copper or aluminum. The carrier layer 1 may be formed by electroplating, and a plating solution for forming the carrier layer 1 may include a copper sulfate solution. The plating solution has a copper content of 15-25 g/L and a pH value of 6-9. The plating solution further includes an additive that includes a brightener sodium sulfonate, a leveler thiourea and a wetting agent polyethylene glycol, the mass concentration of the brightener sodium sulfonate is preferably 0.1-2 g/L, the mass concentration of the leveler thiourea is preferably 0.01-1 g/L, and the mass concentration of the wetting agent polyethylene glycol is preferably 0.1-5 g/L. The carrier layer 1 may be roughened by acidic electroplating. A plating solution for acidic copper plating may include a copper sulfate solution, and the plating solution has a copper content of 10-15 g/L, an acid content of 90-100 g/L and a molybdenum content of 600-800 PPM. The first anti-oxidation layer may be formed in the form of a zinc-nickel alloy by electroplating. In addition, after the first anti-oxidation layer is formed on the roughened carrier layer 1, the first anti-oxidation layer may be subjected to plasma cleaning. The voltage for plasma cleaning is preferably 1500-2500V, and the current is preferably 0.1-1.5 A.

In the embodiments of the disclosure, in order to further prevent bonding between the carrier layer 1 and the metal foil layer 4, the method further comprise the following step after the carrier layer 1 is formed in the present embodiment:

In S113, the carrier layer is annealed under heat treatment conditions, the heat treatment conditions including a heat treatment temperature of 200-300° C. and a heating time of 30-300 minutes. Preferably, the heating time is 1 hour. The carrier layer 1 is annealed under the heat treatment conditions so as to inhibit crystal growth of the carrier layer 1 in the heating process, thereby a diffusion of the carrier layer 1 in the heating process can be delayed, and further bonding between the carrier layer 1 and the metal foil layer 4 can be prevented.

In the embodiments of the disclosure, the striping layer 3 may be made of any one or more of nickel, silicon, molybdenum, graphite, titanium, and niobium.

In the present embodiment, the metal foil layer 4 may be a copper foil or an aluminum foil. The metal foil layer 4 may be formed by electroplating, and a plating solution for forming the metal foil layer 4 may include a copper sulfate solution. The plating solution has a copper content of 15-25 g/L and a pH value of 6-9. The plating solution includes an additive that includes a brightener sodium sulfonate, a leveler thiourea and a wetting agent polyethylene glycol, the mass concentration of the brightener sodium sulfonate is preferably 0.1-2 g/L, the mass concentration of the leveler thiourea is preferably 0.01-1 g/L, and the mass concentration of the wetting agent polyethylene glycol is preferably 0.1-5 g/L. In the embodiments of the disclosure, in order to avoid the warpage of the composite metal foil, the plating solution for preparing the carrier layer 1 and the metal foil layer 4 is the same in the present embodiment, so that the stress effect and the tension effect of the carrier layer 1 and the metal foil layer 4 are the same, the bending degrees of the carrier layer 1 and the metal foil layer 4 are the same, and the warpage of the composite metal foil is further avoided.

In the embodiments of the disclosure, the preparation method of the composite metal foil further includes the following steps:

In S17, a face of the metal foil layer 4 is roughened, which is away from the carrier layer 1.

In S18, a second anti-oxidation layer is formed on the roughened face of the metal foil layer 4, which is away from the carrier layer 1.

The face of the metal foil layer 4 away from the carrier layer 1 may be roughened by acidic electroplating. A plating solution for acidic copper plating may include a copper sulfate solution, and the plating solution for acidic copper plating has a copper content of 10-15 g/L, an acid content of 90-100 g/L and a molybdenum content of 600-800 PPM. The second anti-oxidation layer may be formed in the form of a zinc-nickel alloy by electroplating. In addition, after the second anti-oxidation layer is formed, the second anti-oxidation layer may be subjected to plasma cleaning. The voltage for plasma cleaning is preferably 1500-2500V, and the current is preferably 0.1-1.5 A.

The following embodiments are provided to illustrate the preparation method of the composite metal foil, specifically as follows.

EMBODIMENTS

Embodiment 1

In S41, a carrier layer 1 is formed by electroplating, the carrier layer 1 is roughened, a first anti-oxidation layer is formed on the carrier layer 1, and then the carrier layer 1 is annealed under heat treatment conditions. The heat treatment conditions include a heat treatment temperature of 250° C. and a heating time of 1 hour. The carrier layer 1 is copper. A plating solution for forming the carrier layer 1 includes a copper sulfate solution. The plating solution has a copper content of 20 g/L and a pH value of 7. The plating solution further includes an additive that includes a brightener sodium sulfonate, a leveler thiourea and a wetting agent polyethylene glycol, mass concentration of the brightener sodium sulfonate is preferably 0.8 g/L, the mass concentration of the leveler thiourea is preferably 0.5 g/L, and the mass concentration of the wetting agent polyethylene glycol is preferably 3 g/L. In addition, the carrier layer 1 may be roughened by acidic electroplating. A plating solution for acidic copper plating comprises a copper sulfate solution, and the plating solution for acidic copper plating has a copper content of 13 g/L, an acid content of 95 g/L and a molybdenum content of 700 PPM. The first anti-oxidation layer is formed in the form of a zinc-nickel alloy by electroplating.

In S42, a metal bonding layer 22 on one side of the carrier layer 1 by sputtering, the metal bonding layer 22 being a structure formed by a copper metal layer and a nickel metal layer, the copper metal layer being connected to the carrier layer 1, and the nickel metal layer being connected to a high-temperature resistant layer 21.

In S43, the high-temperature resistant layer 21 is formed on the metal bonding layer 22 by sputtering, the metal bonding layer 22 and the high-temperature resistant layer 21 forming a barrier layer 2, and the high-temperature resistant layer 21 being a single-layer alloy structure made of a tungsten-titanium alloy.

In S44, a striping layer 3 is formed on the barrier layer 2 by sputtering, the striping layer 3 being a graphite layer.

In S45, a metal foil layer 4 is formed on the striping layer 3 by electroplating, the metal foil layer 4 being a copper foil, and a plating solution used for forming the metal foil layer 4 being the same as the plating solution used for the carrier layer 1.

In S46, a face of the metal foil layer 4 away from the carrier layer 1 is roughened, and a second anti-oxidation layer is formed on a roughened face of the metal foil layer 4 in an acid electroplating mode, while the roughened face is away from the carrier layer 1. A plating solution for acidic copper plating comprises a copper sulfate solution, and the plating solution for acidic copper plating has a copper content of 13 g/L, an acid content of 95 g/L and a molybdenum content of 700 PPM, where the second anti-oxidation layer may be formed in the form of a zinc-nickel alloy by electroplating.

Embodiment 2

The present embodiment differs from Embodiment 1 in that the high-temperature resistant layer 21 is a single-layer alloy structure made of a tungsten-nickel alloy. The other processes and steps of the present embodiment are the same as those of Embodiment 1 and will not be described in further detail herein.

Embodiment 3

The present embodiment differs from Embodiment 1 in that the high-temperature resistant layer 21 is a single-layer alloy structure made of a tungsten-molybdenum alloy. The other processes and steps of the present embodiment are the same as those of Embodiment 1 and will not be described in further detail herein.

Embodiment 4

The present embodiment differs from Embodiment 1 in that the high-temperature resistant layer 21 is a single-layer alloy structure made of a chromium-nickel alloy. The other processes and steps of the present embodiment are the same as those of Embodiment 1 and will not be described in further detail herein.

Embodiment 5

The present embodiment differs from Embodiment 1 in that the high-temperature resistant layer 21 is a single-layer alloy structure made of a zirconium-titanium alloy. The other processes and steps of the present embodiment are the same as those of Embodiment 1 and will not be described in further detail herein.

Embodiment 6

The present embodiment differs from Embodiment 1 in that the high-temperature resistant layer 21 is a single-layer alloy structure made of a titanium-nickel alloy. The other processes and steps of the present embodiment are the same as those of Embodiment 1 and will not be described in further detail herein.

Embodiment 7

The present embodiment differs from Embodiment 1 in that the high-temperature resistant layer 21 is a single-layer alloy structure made of a titanium-molybdenum alloy. The other processes and steps of the present embodiment are the same as those of Embodiment 1 and will not be described in further detail herein.

Embodiment 8

The present embodiment differs from Embodiment 1 in that the high-temperature resistant layer 21 is a single-layer alloy structure made of a titanium-cobalt alloy. The other processes and steps of the present embodiment are the same as those of Embodiment 1 and will not be described in further detail herein.

Embodiment 9

The present embodiment differs from Embodiment 1 in that the high-temperature resistant layer 21 is a single-layer alloy structure made of a nickel-molybdenum alloy. The other processes and steps of the present embodiment are the same as those of Embodiment 1 and will not be described in further detail herein.

Embodiment 10

The present embodiment differs from Embodiment 1 in that the high-temperature resistant layer 21 is a single-layer alloy structure made of a molybdenum-cobalt alloy. The other processes and steps of the present embodiment are the same as those of Embodiment 1 and will not be described in further detail herein.

Embodiment 11

The present embodiment differs from Embodiment 1 in that the high-temperature resistant layer 21 is a structure made of a tungsten metal layer and a graphite layer, the tungsten metal layer is connected to the metal bonding layer 22, and the graphite layer is connected to the striping layer 3. The other processes and steps of the present embodiment are the same as those of Embodiment 1 and will not be described in further detail herein.

Embodiment 12

The present embodiment differs from Embodiment 1 in that the high-temperature resistant layer 21 is a structure made of a chromium metal layer and a graphite layer, the chromium metal layer is connected to the metal bonding layer 22, and the graphite layer is connected to the striping layer 3. The other processes and steps of the present embodiment are the same as those of Embodiment 1 and will not be described in further detail herein.

Embodiment 13

The present embodiment differs from Embodiment 1 in that the high-temperature resistant layer 21 is a structure made of a nickel metal layer and a graphite layer, the nickel metal layer is connected to the metal bonding layer 22, and the graphite layer is connected to the striping layer 3. The other processes and steps of the present embodiment are the same as those of Embodiment 1 and will not be described in further detail herein.

Embodiment 14

The present embodiment differs from Embodiment 1 in that the high-temperature resistant layer 21 is a structure made of a tungsten-nickel alloy and a chromium metal layer, the tungsten-nickel alloy is connected to the metal bonding layer 22, and the chromium metal layer is connected to the striping layer 3. The other processes and steps of the present embodiment are the same as those of Embodiment 1 and will not be described in further detail herein.

Embodiment 15

The present embodiment differs from Embodiment 1 in that the high-temperature resistant layer 21 is a structure made of a nickel-molybdenum alloy and a chromium metal layer, the nickel-molybdenum alloy is connected to the metal bonding layer 22, and the chromium metal layer is connected to the striping layer 3. The other processes and steps of the present embodiment are the same as those of Embodiment 1 and will not be described in further detail herein.

Embodiment 16

The present embodiment differs from Embodiment 1 in that the high-temperature resistant layer 21 is a structure made of a molybdenum-cobalt alloy and a chromium metal layer, the molybdenum-cobalt alloy is connected to the metal bonding layer 22, and the chromium metal layer is connected to the striping layer 3. The other processes and steps of the present embodiment are the same as those of Embodiment 1 and will not be described in further detail herein.

Embodiment 17

The present embodiment differs from Embodiment 1 in that the high-temperature resistant layer 21 is a structure made of a titanium-nickel alloy and a chromium metal layer, the titanium-nickel alloy is connected to the metal bonding layer 22, and the chromium metal layer is connected to the striping layer 3. The other processes and steps of the present embodiment are the same as those of Embodiment 1 and will not be described in further detail herein.

Embodiment 18

In S41, a carrier layer 1 is formed by electroplating, then the carrier layer 1 is roughened. A first anti-oxidation layer is formed on the carrier layer 1, and then the carrier layer 1 is annealed under heat treatment conditions. The heat treatment conditions comprise: a heat treatment temperature of 250° C. and a heating time of 1 hour. The carrier layer 1 is copper. A plating solution for forming the carrier layer 1 includes a copper sulfate solution. The plating solution has a copper content of 20 g/L and a pH value of 7. The plating solution further includes an additive that includes a brightener sodium sulfonate, a leveler thiourea and a wetting agent polyethylene glycol, the mass concentration of the brightener sodium sulfonate is preferably 0.8 g/L, the mass concentration of the leveler thiourea is preferably 0.5 g/L, and the mass concentration of the wetting agent polyethylene glycol is preferably 3 g/L. In addition, the carrier layer 1 may be subjected to a first roughening treatment by acidic electroplating. A plating solution for acidic copper electroplating includes a copper sulfate solution, and the plating solution for acidic copper plating has a copper content of 13 g/L, an acid content of 95 g/L and a molybdenum content of 700 PPM. The first anti-oxidation layer is formed in the form of zinc-nickel alloy by electroplating.

In S42, a metal bonding layer 22 on one side of the carrier layer 1 by sputtering, the metal bonding layer 22 being a structure formed by a copper metal layer and a nickel metal layer, the copper metal layer being connected to the carrier layer 1, the nickel metal layer being connected to a high-temperature resistant layer 21, the thickness of the metal bonding layer 22 being 60 Å.

In S43, the high-temperature resistant layer 21 is formed on the metal bonding layer 22 by sputtering, the metal bonding layer 22 and the high-temperature resistant layer 21 forming a barrier layer 2, the high-temperature resistant layer 21 being a titanium metal layer, and the thickness of the high-temperature resistant layer 21 being 200 Å.

In S44, a striping layer 3 is formed on the barrier layer 2 by sputtering, the striping layer 3 being a graphite layer with the thickness of 45 Å.

In S45, a metal foil layer 4 is formed on the striping layer 3 in an electroplating mode, the metal foil layer 4 being a copper foil, a plating solution used for forming the metal foil layer 4 being the same as the plating solution used for the carrier layer 1, and the thickness being 4 μm.

In S46, a face of the metal foil layer 4 away from the carrier layer 1 is subjected to a second roughening treatment, and a second anti-oxidation layer is formed on the roughened face of the metal foil layer 4 in an acid electroplating mode, which is away from the carrier layer 1. A plating solution for acidic copper plating comprises a copper sulfate solution, and the plating solution for acidic copper plating has a copper content of 13 g/L, an acid content of 95 g/L and a molybdenum content of 700 PPM, where the second anti-oxidation layer may be formed in the form of galvanizing a zinc-nickel alloy by electroplating.

Embodiment 19

The present embodiment differs from Embodiment 18 in that the metal bonding layer 22 is a copper metal layer. The other processes and steps of the present embodiment are the same as those of Embodiment 1 and will not be described in further detail herein.

Embodiment 2

The present embodiment differs from Embodiment 18 in that the plating solutions forming the carrier layer 1 and the metal foil layer 4 have the same composition, and the plating solutions have a copper content of 20 g/L and a pH value of 7. An additive includes a brightener sodium sulfonate, a leveler thiourea and a wetting agent polyethylene glycol, the mass concentration of the brightener sodium sulfonate is 0.8 g/L, the mass concentration of the leveler thiourea is 0.5 g/L, and the mass concentration of the wetting agent polyethylene glycol is 3 g/L.

Embodiment 21

The present embodiment differs from Embodiment 18 in that the metal bonding layer 22, the barrier layer 2 and the striping layer 3 are formed by evaporation plating.

Embodiment 22

The present embodiment differs from Embodiment 18 in that an annealing treatment temperature is 150° C., and a heating time is 120 minutes.

Embodiment 23

The present embodiment differs from Embodiment 18 in that the first roughening treatment and the second roughening treatment are not performed.

Comparative Example 1

The present embodiment differs from Embodiment 1 in that after forming the carrier layer 1, the barrier layer 2 is not made, but the striping layer 3 is formed directly on the carrier layer 1. The other processes and steps of the present embodiment are the same as those of Embodiment 1 and will not be described in further detail herein.

Comparative Example 2

The present embodiment differs from Embodiment 1 in that after forming the metal bonding layer 22, the high-temperature resistant layer 21 is not made, but the striping layer 3 is formed directly on the metal bonding layer 22. The other processes and steps of the present embodiment are the same as those of Embodiment 1 and will not be described in further detail herein.

Comparative Example 3

The present embodiment differs from Embodiment 1 in that after forming the carrier layer 1, the metal bonding layer 22 is not made, but the high-temperature resistant layer 21 is formed directly on the carrier layer 1. The other processes and steps of the present embodiment are the same as those of Embodiment 1 and will not be described in further detail herein.

Table 1 is a test result that the composite metal foils prepared in Embodiments 1 to 23 were directly subjected to a plurality of tests at a normal temperature (for example, 16 to 27° C., taking 25° C. as an example), or were subjected to a plurality of tests at different temperatures (200° C. and 340° C.) after being press-fitted with a flexible insulating base film, respectively, including the tested peel strength between the carrier layer 1 and the barrier layer 2 and the peel strength between the striping layer 3 and the metal foil layer 4.

TABLE 1

| | Directly test at 25° C. | | Press-fit at 200° C. | | Press-fit at 340° C. | |
|---|---|---|---|---|---|---|
| | Peel strength between striping layer and metal foil layer (N/cm) | Peel strength between carrier layer and barrier layer (adhesion test level) | Peel strength between striping layer and metal foil layer (N/cm) | Peel strength between carrier layer and barrier layer (adhesion test level) | Peel strength between striping layer and metal foil layer (N/cm) | Peel strength between carrier layer and barrier layer (adhesion test level) |
| Embodiment 1 | 0.05~0.09 | 1 | 0.09~0.11 | 1 | 0.15~0.18 | 1 |
| Embodiment 2 | 0.07~0.10 | 1 | 0.10~0.13 | 1 | 0.17~0.20 | 1 |
| Embodiment 3 | 0.05~0.09 | 1 | 0.09~0.11 | 1 | 0.15~0.18 | 1 |
| Embodiment 4 | 0.15~0.19 | 0 | 0.21~0.25 | 0 | 0.26~0.34 | 0 |
| Embodiment 5 | 0.06~0.10 | 0 | 0.11~0.14 | 0 | 0.16~0.21 | 0 |
| Embodiment 6 | 0.18~0.20 | 0 | 0.23~0.39 | 0 | 0.20~0.50 | 0 |
| Embodiment 7 | 0.16~0.20 | 0 | 0.22~0.26 | 0 | 0.27~0.35 | 0 |
| Embodiment 8 | 0.09~0.13 | 1 | 0.11~0.16 | 1 | 0.16~0.25 | 1 |
| Embodiment 9 | 0.18~0.20 | 0 | 0.23~0.39 | 0 | 0.41~0.50 | 0 |
| Embodiment 10 | 0.17~0.21 | 1 | 0.23~0.27 | 1 | 0.28~0.36 | 1 |
| Embodiment 11 | 0.07~0.13 | 1 | 0.14~0.16 | 1 | 0.17~0.28 | 1 |
| Embodiment 12 | 0.10~0.14 | 1 | 0.15~0.19 | 1 | 0.20~0.31 | 1 |
| Embodiment 13 | 0.17~0.21 | 0 | 0.23~0.27 | 0 | 0.28~0.36 | 0 |
| Embodiment 14 | 0.06~0.11 | 1 | 0.12~0.15 | 1 | 0.16~0.22 | 1 |
| Embodiment 15 | 0.06~0.11 | 1 | 0.12~0.14 | 1 | 0.15~0.26 | 1 |
| Embodiment 16 | 0.08~0.12 | 1 | 0.10~0.16 | 1 | 0.15~0.25 | 1 |
| Embodiment 17 | 0.09~0.14 | 1 | 0.15~0.17 | 1 | 0.18~0.28 | 1 |
| Embodiment 18 | 0.08~0.12 | 1 | 0.15~0.2 | 1 | 0.23~0.35 | 1 |
| Embodiment 19 | 0.13~0.19 | 1 | 0.2~0.25 | 1 | 0.27~0.35 | 1 |
| Embodiment 20 | 0.06~0.09 | 1 | 0.1~0.16 | 1 | 0.17~0.24 | 1 |

TABLE 1-continued

|  | Directly test at 25° C. | | Press-fit at 200° C. | | Press-fit at 340° C. | |
| --- | --- | --- | --- | --- | --- | --- |
|  | Peel strength between striping layer and metal foil layer (N/cm) | Peel strength between carrier layer and barrier layer (adhesion test level) | Peel strength between striping layer and metal foil layer (N/cm) | Peel strength between carrier layer and barrier layer (adhesion test level) | Peel strength between striping layer and metal foil layer (N/cm) | Peel strength between carrier layer and barrier layer (adhesion test level) |
| Embodiment 21 | 0.12~0.19 | 3 | 0.21~0.26 | 3 | 0.28~0.34 | 3 |
| Embodiment 22 | 0.08~0.12 | 2 | 0.15~0.2 | 2 | 0.23~0.35 | 2 |
| Embodiment 23 | 0.08~0.12 | 3 | 0.15~0.2 | 3 | 0.23~0.35 | 3 |
| Comparative Example 1 | 2.80~2.92 | / | 3.21~3.62 | / | 3.85~4.10 | / |
| Comparative Example 2 | 1.32~1.50 | 2 | 1.65~1.82 | 2 | 1.86~1.92 | 2 |
| Comparative Example 3 | 0.56~0.67 | 3 | 0.71~0.85 | 3 | 0.92~1.08 | 3 |

Since the carrier layer 1 and the metal foil layer 4 are diffused under a high-temperature condition, the carrier layer 1 and the metal foil layer 4 can bond to a certain extent. Therefore, the peel strength between the carrier layer 1 and the barrier layer 2 and the peel strength between the striping layer 3 and the metal foil layer 4 increase with increasing temperature. However, it can be seen from Table 1 that regardless of the composite metal foils prepared in Embodiments 1-17 under normal temperature or high temperature conditions, the adhesion test level between the carrier layer 1 and the barrier layer 2 is in the first three levels. That is, an adhesive force between the carrier layer 1 and the barrier layer 2 is relatively large, and the peel strength between the striping layer 3 and the metal foil layer 4 is very small. Therefore, the peel strength between the carrier layer 1 and the barrier layer 2 is always far greater than the peel strength between the striping layer 3 and the metal foil layer 4, so that when the composite metal foil is used, the carrier layer 1, the barrier layer 2 and the striping layer 3 can be conveniently peeled off from the metal foil layer 4 at the same time. By comparing Embodiments 18 to 23, it can be seen that it is advantageous to improve the overall performance of a metal foil by limiting the process conditions of the metal foil within the preferred range. However, in Comparative Examples 1 to 3 under the high temperature condition, the mutual diffusion of the composite metal foil prepared is serious, so that the carrier layer 1 is bonded with the metal foil layer 4 to a large extent, thereby causing inconvenience in peeling off the carrier layer 1, the barrier layer 2 and the striping layer 3 from the metal foil layer 4 at the same time when the composite metal foil is used.

In summary, the embodiments of the disclosure provide a composite metal foil and a preparation method thereof. The composite metal foil comprises a carrier layer 1, a barrier layer 2, a striping layer 3, and a metal foil layer 4 sequentially stacked, the barrier layer 2 includes a metal bonding layer 22 and a high-temperature resistant layer 21 stacked, and the metal bonding layer 22 is disposed between the carrier layer 1 and the high-temperature resistant layer 21. The striping layer 3 is disposed between the carrier layer 1 and the metal foil layer 4 so as to facilitate peeling of the carrier layer 1. And the barrier layer 2 is disposed between the carrier layer 1 and the metal foil layer 4 so as to prevent the carrier layer 1 and the metal foil layer 4 from bonding caused by diffusing mutually at a high temperature, so that the carrier layer 1 and the metal foil layer 4 are easy to peel off. In addition, the metal bonding layer 22 is disposed between the carrier layer 1 and the high-temperature resistant layer 21, so that the barrier layer 2 is not easy to separate from the carrier layer 1, and peeling between the barrier layer 2 and the carrier layer 1 is prevented.

The above is only a preferred implementation manner of the disclosure. It is to be noted that a number of modifications and replacements may be made by those of ordinary skill in the art without departing from the principles of the disclosure, and such modifications and replacements should also be considered to be within the scope of protection of the disclosure.

What is claimed is:

1. A composite metal foil, comprising a carrier layer, a barrier layer, a striping layer and a metal foil layer, wherein the carrier layer, the barrier layer, the striping layer and the metal foil layer are sequentially stacked, the barrier layer comprises a metal bonding layer and a high-temperature resistant layer which are stacked, and the metal bonding layer is disposed between the carrier layer and the high-temperature resistant layer; the metal bonding layer is made of any one or more materials of a first type of metal; or the metal bonding layer is made of any one or more materials in a first type of metal and materials in a second type of metal; the first type of metal is copper or zinc, and the second type of metal is iron; the high-temperature resistant layer is made of a single-layer alloy structure made of a zirconium-titanium alloy, or titanium-cobalt alloy, or molybdenum-cobalt alloy; or the high-temperature resistant layer is a multilayer structure formed by a tungsten metal layer and a graphite layer, or a chromium metal layer and a graphite layer, or a nickel metal layer and a graphite layer, or molybdenum-cobalt alloy and a chromium metal layer.

2. The composite metal foil according to claim 1, wherein a peel strength between the carrier layer and the barrier layer is greater than the peel strength between the striping layer and the metal foil layer at a temperature of 20-400° C.

3. The composite metal foil according to claim 2, wherein an adhesion test level between the carrier layer and the barrier layer is 0 or 1 or 2, and the peel strength between the striping layer and the metal foil layer is 0.001-2 N/cm.

4. The composite metal foil according to claim 1, wherein the peel strength between the striping layer and the metal foil layer is greater than or equal to the peel strength between the striping layer and the barrier layer.

5. The composite metal foil according to claim 1, wherein the metal bonding layer is a single metal layer made of the first type of metal or the second type of metal; or the metal bonding layer is a single-layer alloy structure made of the first type of metal and the second type of metal; or the metal bonding layer comprises a single metal layer which is made of the first type of metal and connected to the carrier layer, and the metal bonding layer further comprises a single metal layer which is made of the second type of metal and connected to the high-temperature resistant layer; or the metal bonding layer comprises a multilayer structure formed by an alloy layer and a single metal layer, the alloy layer being made of the first type of metal and the second type of metal, and the single metal layer being made of the first type of metal or the second type of metal.

6. The composite metal foil according to claim 1, wherein the striping layer is made of any one or more of nickel, silicon, molybdenum, graphite, titanium, and niobium; or, the striping layer is made of an organic polymer material.

7. The composite metal foil according to claim 1, wherein a thickness of the metal foil layer is less than or equal to 9 μm; the metal foil layer is a copper foil or an aluminum foil; and/or, the carrier layer is made of copper or aluminum or an organic thin film; a roughness Rz of a face of the carrier layer is less than or equal to 5 μm, and the face is close to the metal foil layer; and/or the roughness Rz of a face of the metal foil layer is less than or equal to 3.0 μm, and the face is away from the carrier layer.

8. The composite metal foil according to claim 1, wherein a first anti-oxidation layer is disposed on a side of the carrier layer, and the side of the carrier layer is close to the barrier layer; and/or a second anti-oxidation layer is disposed on a side of the metal foil layer, and the side of the metal foil layer is away from the barrier layer.

9. A preparation method of the composite metal foil according to claim 1, comprising:
   S11: forming the carrier layer;
   S12: forming the metal bonding layer on one side of the carrier layer;
   S13: forming the high-temperature resistant layer on the metal bonding layer, the metal bonding layer and the high-temperature resistant layer forming the barrier layer;
   S14: forming the striping layer on the barrier layer; and
   S15: forming the metal foil layer on the striping layer.

10. The preparation method according to claim 9, wherein step S12, step S13 and step S14 are performed by sputtering respectively.

11. The preparation method according to claim 9, wherein before step S12, step S11 further comprises:
   S111: performing a first roughening treatment on the carrier layer to obtain the carrier layer with a first roughened face; and
   S112: forming a first anti-oxidation layer on the first roughened face.

12. The preparation method according to claim 9, wherein the carrier layer is formed by electroplating, a first plating solution used for forming the carrier layer comprises 15-25 g/L of copper sulfate, 0.1-2 g/L of sodium sulfonate, 0.01-1 g/L of thiourea, and 0.1-5 g/L of polyethylene glycol at a pH of 6-9.

13. The preparation method according to claim 11, wherein the first roughening treatment process is performed by acidic electroplating using a first electroplating solution, the first electroplating solution comprising 10-15 g/L of copper ion, 90-100 g/L of acid and 600-800 PPM of molybdenum ion.

14. The preparation method according to claim 9, wherein before forming the metal bonding layer, the preparation method further comprising:
   S113: annealing the carrier layer, a heat treatment temperature in a annealing treatment process being 200-300° C. and a heating time in the annealing treatment process being of 30-300 minutes.

15. The preparation method according to claim 13, further comprising: forming the metal foil layer by an electroplating method, wherein a second plating solution used in the process of forming the metal foil layer has the same composition as the first plating solution.

16. The preparation method according to claim 15, further comprising:
   S31: performing a second roughening treatment on a face of the metal foil layer to obtain a second roughened face, and the face of the metal foil layer being away from the carrier layer; and
   S32: forming a second anti-oxidation layer on the second roughened face of the metal foil layer.

17. The preparation method according to claim 10, wherein currents of the sputtering processes in step S12, step S13 and step S14 are each independently selected from the range of 6-12A, and the voltages are each independently selected from the range of 300-500V.

18. The preparation method according to claim 11, wherein the carrier layer is a copper metal layer or an aluminum metal layer.

19. The preparation method according to claim 13, wherein the first anti-oxidation layer is formed by galvanizing a zinc-nickel alloy.

20. The preparation method according to claim 14, wherein the heating time is 1 hour.

21. The preparation method according to claim 16, wherein the first roughening treatment step is performed by acidic electroplating with a second acidic plating solution, the second acidic plating solution comprising 10-15 g/L of copper ion, 90-100 g/L of acid and 600-800 PPM of molybdenum ion.

22. The preparation method according to claim 16, wherein the second anti-oxidation layer is formed by galvanizing a zinc-nickel alloy.

* * * * *